United States Patent
Sheu et al.

(10) Patent No.: US 8,199,561 B2
(45) Date of Patent: Jun. 12, 2012

(54) PHASE CHANGE MEMORY

(75) Inventors: Shyh-Shyuan Sheu, Taichung (TW); Pei-Chia Chiang, Taipei (TW); Wen-Pin Lin, Changhua County (TW)

(73) Assignee: Higgs OPL. Capital LLC, Dover, DE (US)

( * ) Notice: Subject to any disclaimer, the term of this patent is extended or adjusted under 35 U.S.C. 154(b) by 286 days.

(21) Appl. No.: 12/563,971

(22) Filed: Sep. 21, 2009

(65) Prior Publication Data
US 2010/0165723 A1 Jul. 1, 2010

(30) Foreign Application Priority Data
Dec. 31, 2008 (TW) ............................ 97151765 A

(51) Int. Cl.
*G11C 11/00* (2006.01)
(52) U.S. Cl. .................. 365/158; 365/171; 365/173
(58) Field of Classification Search .................. 365/158, 365/171, 173
See application file for complete search history.

(56) References Cited

U.S. PATENT DOCUMENTS

| 6,487,113 | B1 | 11/2002 | Park et al. | |
|---|---|---|---|---|
| 7,259,982 | B2 * | 8/2007 | Johnson | 365/163 |
| 7,423,897 | B2 * | 9/2008 | Wicker | 365/148 |
| 7,447,092 | B2 * | 11/2008 | Cho et al. | 365/212 |

* cited by examiner

*Primary Examiner* — Son Dinh
*Assistant Examiner* — Nam Nguyen
(74) *Attorney, Agent, or Firm* — Stolowitz Ford Cowger LLP

(57) ABSTRACT

A phase change memory with an operating current that can be gradually increased or gradually decreased. The phase change memory has a phase change storage element, a transistor, and a control circuit. The transistor is operable to adjust the operating current flowing through the phase change storage element. The transistor has a first terminal coupled to a voltage source, a second terminal coupled to the phase change storage element, and a control terminal receiving a control signal from the control circuit. The control circuit is specially designed to limit the transistor in a linear region.

10 Claims, 8 Drawing Sheets

PHASE CHANGE MEMORY

CROSS REFERENCE TO RELATED APPLICATIONS

This application claims priority of Taiwan Patent Application No. 097151765, filed on Dec. 31, 2008, the entirety of which is incorporated by reference herein.

BACKGROUND

1. Technical Field

The present disclosure relates to phase change memories (PCMs).

2. Description of the Related Art

Phase change materials have at least two phases: a crystalline phase, and an amorphous phase. A phase change memory uses phase change materials as storage elements therein (hereinafter named phase change storage elements). A crystalline phase is represented as logic '0' and an amorphous phase is represented as logic '1'.

The transformation between the crystalline phase and the amorphous phase is controlled by an operating current flowing through the phase change storage element. Table 1 is a comparison of operating current for a crystalline phase and an amorphous phase.

TABLE 1

Comparison of write current for a crystalline phase and an amorphous phase.

| | Operating current (in pulse form, oscillating between high and low voltage levels) | |
|---|---|---|
| | magnitude | duty period |
| crystalline phase | Low | Long |
| amorphous phase | High | Short |

Achieving complete crystallization is difficult. For example, an inappropriate operating current may result in incomplete crystallization, which affects reliability of the phase change storage element.

BRIEF SUMMARY

The disclosure unveils phase change memories. The phase change memory comprises a phase change storage element, a transistor for operating current adjustment and a control circuit. The transistor for operating current adjustment has a first terminal coupled to a voltage source, a second terminal coupled to the phase change storage element, and a control terminal receiving a control signal from the control circuit. The control circuit uses the control signal to limit the transistor in a linear region.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION

The following description shows several exemplary embodiments carrying out the disclosure. This description is made for the purpose of illustrating the general principles of the disclosure and should not be taken in a limiting sense. The scope of the disclosure is best determined by reference to the appended claims.

Figure 1A:
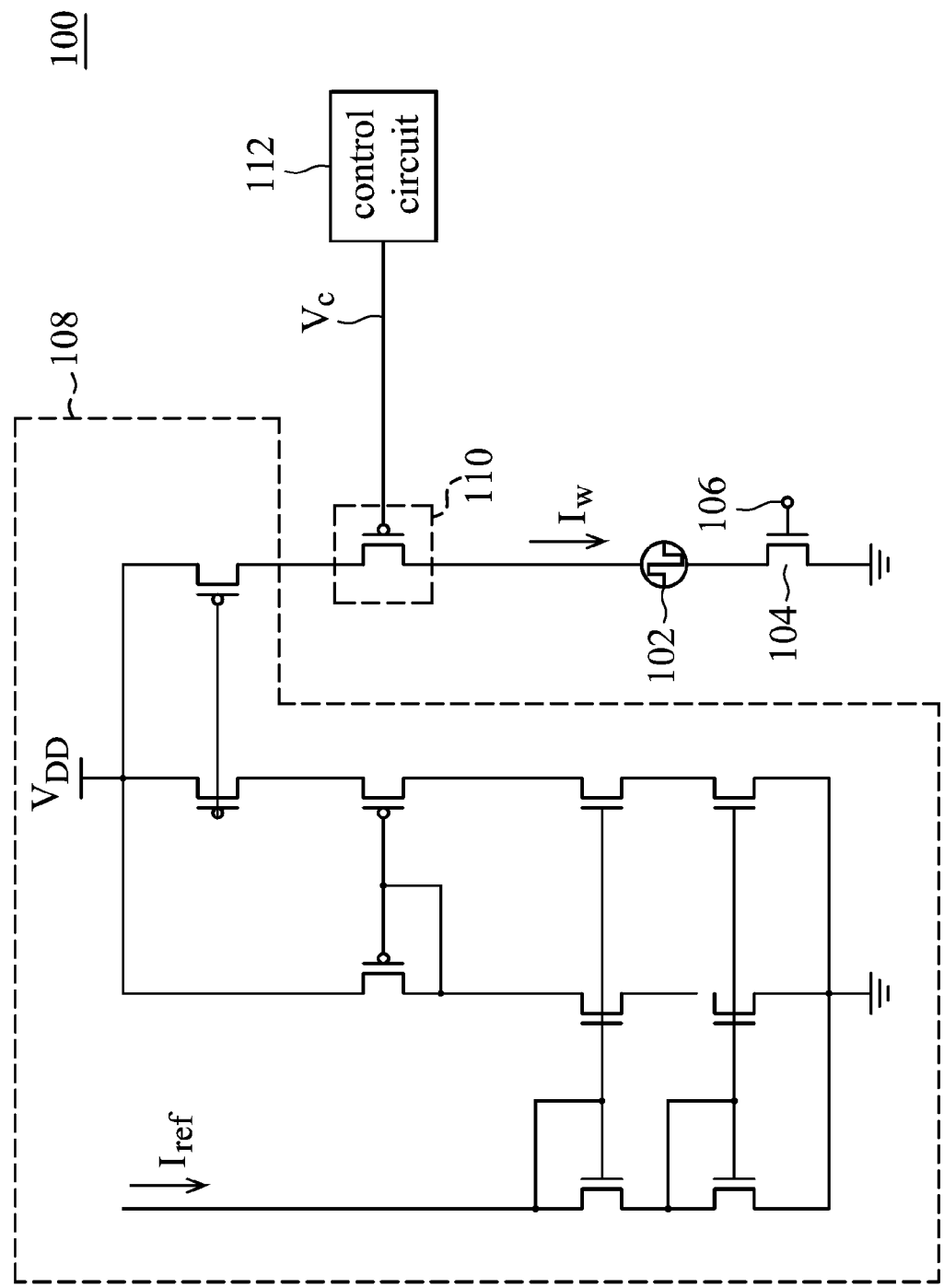
FIG. 1A depicts an exemplary embodiment of the phase change memory of the disclosure.

FIG. 1A depicts an exemplary embodiment of the phase change memory of the disclosure. A phase change memory 100 comprises a phase change storage element 102 which uses more than one phase, such as a crystalline state and an amorphous state, to store different logic values. As shown, a switch 104 is controlled by a word line 106 of the phase change memory 100. When the switch 104 is turned on, an operating current $I_w$ is allowed to flow into the phase change storage element 102 to read or write the phase change storage element 102. The operating current $I_w$ is dependent on the statuses of a current generator 108 and a operating current adjustment transistor 110. The structure of the current generator 108 does not limit the scope of the disclosure and may be replaced by other current generating circuits known by those skilled in the art. In FIG. 1A, the current generator 108 generates a current according to a reference current $I_{ref}$, and the current generator 108 is coupled between a voltage source $V_{DD}$ and the transistor 110. In this embodiment, the transistor 110 for operating current adjustment is realized by a P-type metal-oxide-semiconductor (PMOS) transistor, which has a source, a drain and a gate working as a first terminal, a second terminal and a control terminal of the transistor 110, respectively. In the following, a description of the connection of the transistor 110 (PMOS) is provided. As shown in FIG. 1A, the first terminal (source) is coupled to the voltage source $V_{DD}$ by the current generator 108, the second terminal (drain) is coupled to the phase change storage element 102, and the control terminal (gate) is controlled by a control signal $V_c$ provided by a control circuit 112. The control circuit 112 is designed to limit the transistor 110 in a linear region but not in a saturated region. Note that if the voltage level of the control signal $V_c$ is decreasing, then a result would be that the current value of the operating current $I_w$ would be concurrently increasing, and if the voltage level of the control signal $V_c$ is increasing, then a result would be that the current value of the operating current $I_w$ would be concurrently decreasing.

When transforming the phase change storage element 102 to a crystalline phase, a gradually increased operation current $I_w$ facilitates the crystallization process. Thus, the magnitude of the operation current $I_w$ is effectively reduced. Furthermore, a gradually decreased operation current $I_w$ facilitates the temper of the crystallization. Thus, the phase change storage element 102 can be completely crystallized.

Figure 1B:
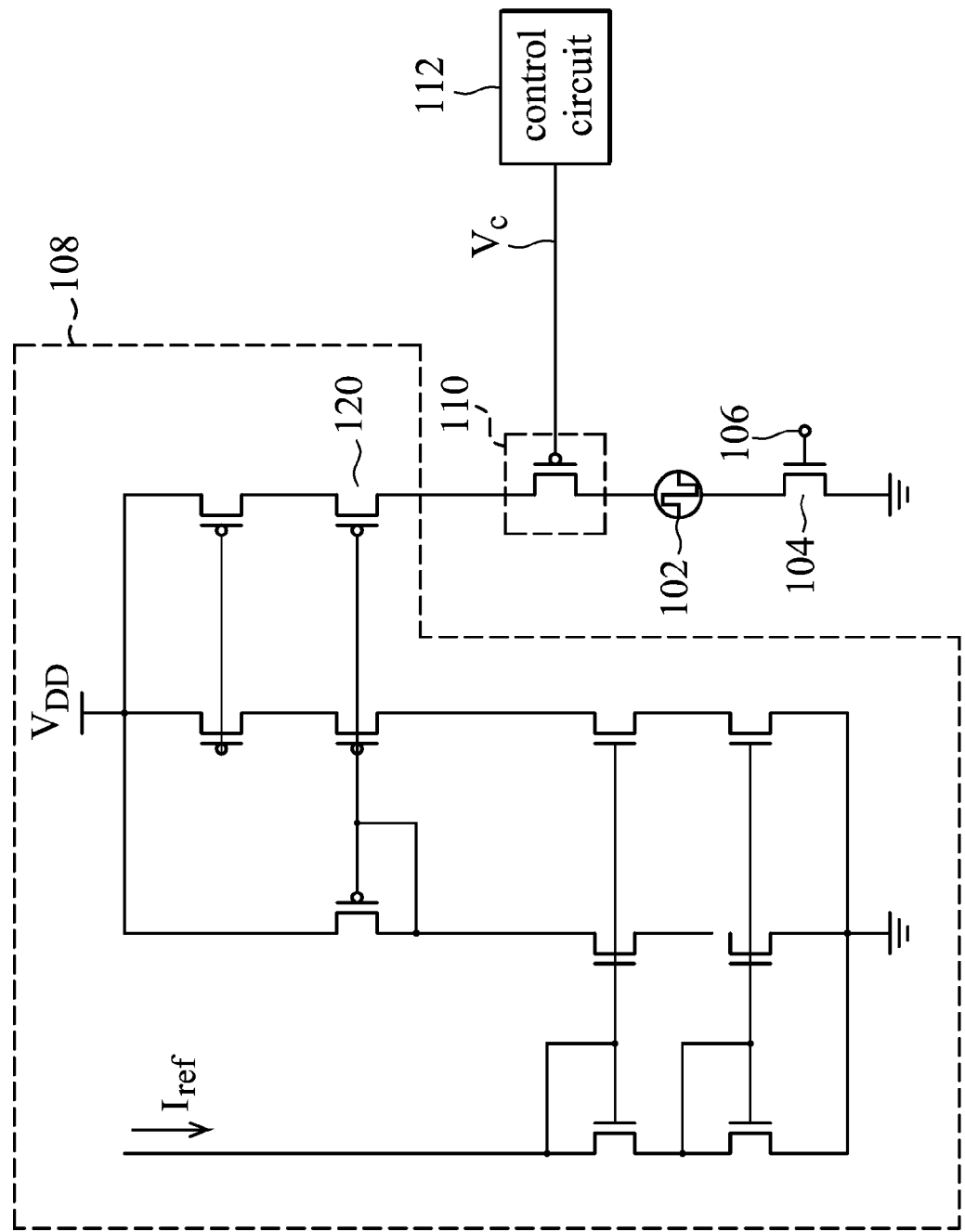
FIG. 1B depicts another exemplary embodiment of the phase change memory of the disclosure.

FIG. 1B depicts another exemplary embodiment of the phase change memory of the disclosure, wherein the current generator 108 is realized by another circuit. Compared to the circuit shown in FIG. 1A, the current generator 108 of FIG. 1B further comprises a transistor 120. The current generators 108 shown in FIGS. 1A and 1B do not limit the scope of the disclosure, and may be replaced by other circuits known by those skilled in the art.

Figure 2A:
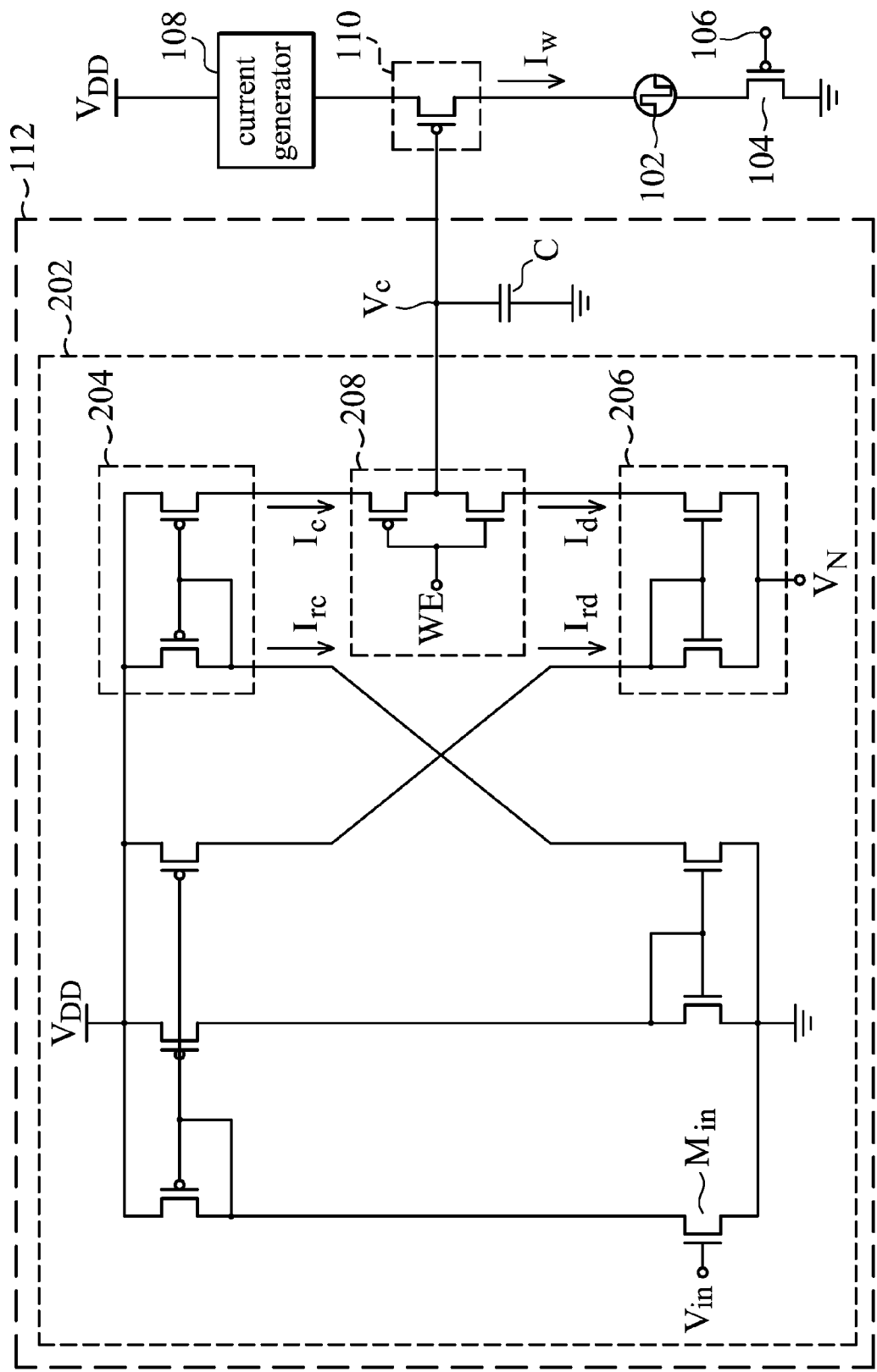
FIG. 2A depicts another exemplary embodiment of the phase change memory of the disclosure.

FIG. 2A depicts another exemplary embodiment of the phase change memory of the disclosure, which details an exemplary embodiment of the control circuit 112. As shown, the control circuit 112 comprises a capacitor C and a charge/discharge circuit 202. The capacitor C is coupled to the control terminal of the transistor 110. The voltage held by the capacitor C is the control signal $V_c$. The charge/discharge circuit 202 charges or discharges the capacitor C to vary the control signal $V_c$ between a first predetermined voltage $V_N$ and the source voltage $V_{DD}$. The lower limit, $V_N$, of the control signal $V_c$ limits the transistor of the current adjuster 110 to work in a linear region. Thus, in the example shown in FIG. 2A, when the control signal $V_c$ is gradually decreased, the operating current $I_w$ is gradually increased; and when the control signal $V_c$ is gradually increased, the operating current $I_w$ is gradually decreased. The first pre-determined voltage $V_N$ is higher than the voltage level of the ground (GND).

This paragraph details the circuit of the charge/discharge circuit 202 of FIG. 2A. As shown in FIG. 2A, the charge/discharge circuit 202 comprises a first current mirror 204, a second current mirror 206 and a charge/discharge switch 208. The first current minor 204 comprises a power terminal coupled to the voltage source $V_{DD}$, a reference current terminal for a charge reference current $I_{rc}$ to pass through, and a load terminal outputting a charge current $I_c$. The second current minor 206 comprises a power terminal biased at the first per-determined voltage $V_N$, a reference current terminal receiving a discharge reference current $I_{rd}$, and a load terminal providing a discharge current $I_d$. The charge/discharge circuit 202 requires a bias voltage $V_{in}$ for setting the values of the charge reference current $I_{rc}$ and the discharge reference current $I_{rd}$. In another embodiment, the bias voltage $V_{in}$ may be dependent on the source voltage of the transistor $M_{in}$. For example, the gate and source of the transistor $M_{in}$ may be electrically connected. and thus, the values of the charge current $I_c$ and the discharge current $I_d$ are determined. The charge/discharge switch 208 is controlled by a switching signal WE to couple the capacitor C to the first current mirror 204 for a charge process or to the second current mirror 206 for a discharge process.

Figure 2B:
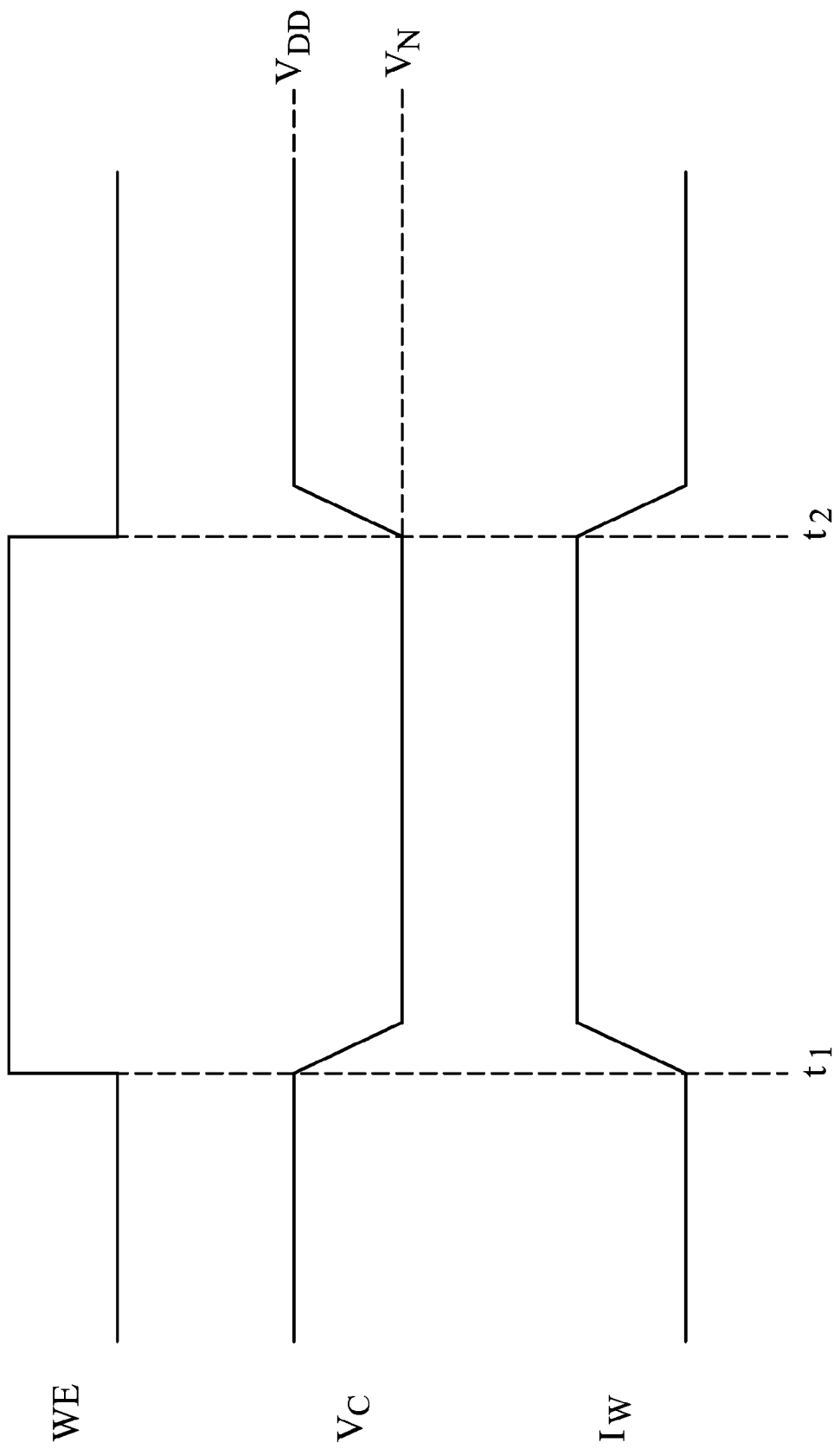
FIG. 2B shows waveforms depicting exemplary embodiments of the switching signal WE, the control signal $V_c$ and the operating current $I_w$ of FIG. 2A.

FIG. 2B shows waveforms depicting exemplary embodiments of the switching signal WE, the control signal $V_c$ and the operating current $I_w$ of FIG. 2A. At time index $t_1$, the switching signal WE is switched to high, and the charge/discharge switch 208 couples the capacitor C to the second current mirror 206 to discharge the capacitor C. When the capacitor C is discharged by the discharge current $I_d$, the control signal $V_c$ is decreased. At time index $t_2$, the switching signal WE is switched to low, and the charge/discharge switch 208 is switched to couple the capacitor C to the first current mirror 204 to charge the capacitor C. When the capacitor C is charged by the charge current $I_c$, the voltage level of the control signal $V_c$ is raised. Because the power terminals of the first and second current minors 204 and 206 are biased at the source voltage $V_{DD}$ and the first pre-determined voltage $V_N$, respectively, the control signal $V_c$ is limited between the voltage levels $V_N$ and $V_{DD}$, and thus, the transistor of the current adjuster 110 is operated in a linear region. According to the electronic characteristic of a PMOS transistor that is in a linear region, if the voltage level of the control signal $V_c$ is decreasing, then a result would be that the current value of the operating current $I_w$ would be concurrently increasing, and if the voltage level of the control signal $V_c$ is increasing, then a result would be that the current value of the operating current $I_w$ would be concurrently decreasing. Thus, the operating current $I_w$ is increased gradually and then decreased gradually as shown in FIG. 2B.

Figure 3A:
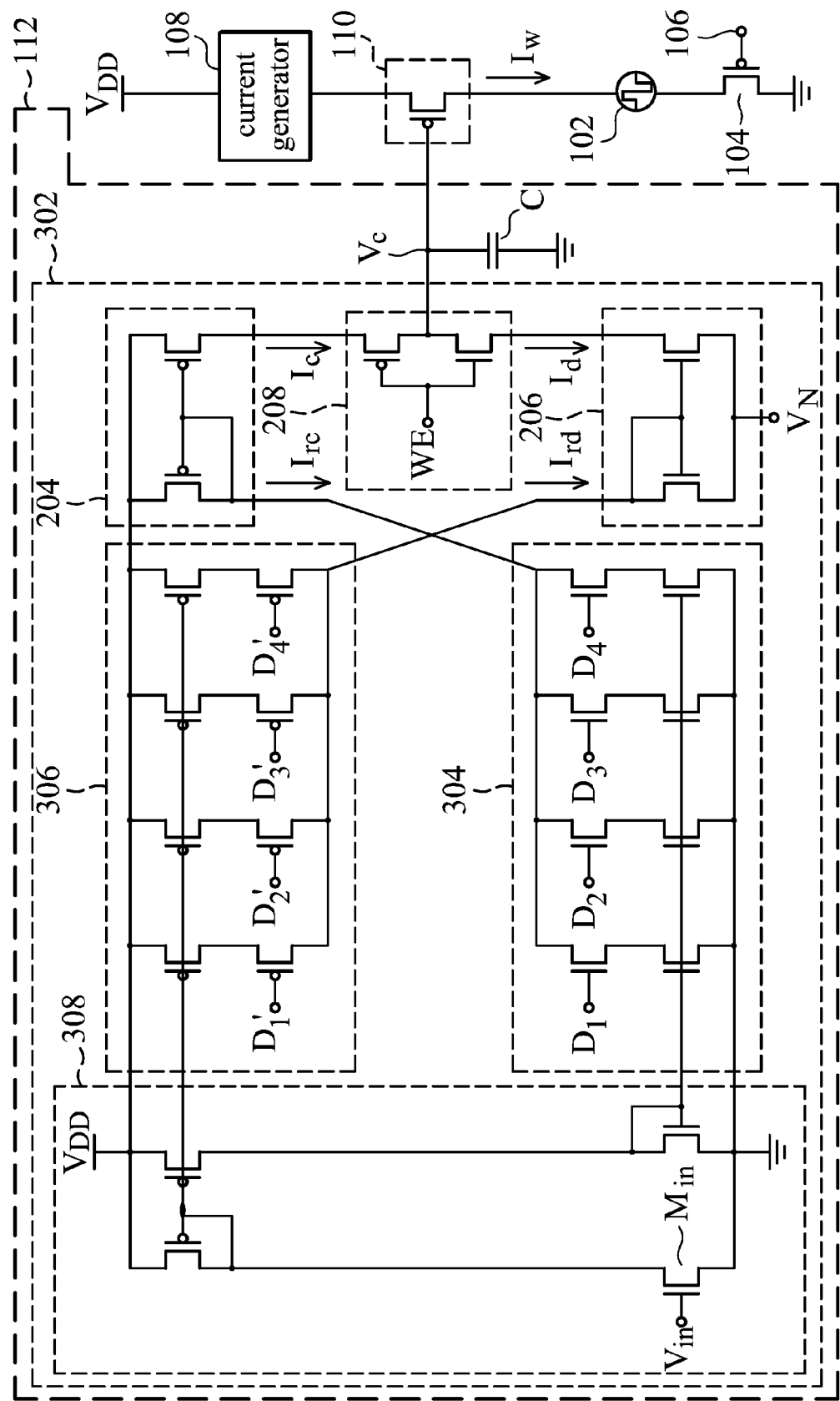
FIG. 3A depicts another exemplary embodiment of the phase change memory of the disclosure.

FIG. 3A depicts another exemplary embodiment of the phase change memory of the disclosure. Compared with the charge/discharge circuit 202 of FIG. 2A, the charge/discharge circuit 302 of FIG. 3A further comprises a first digital-to-analog converter 304 and a second digital-to-analog converter 306. The first and second digital-to-analog converters 304 and 306 are biased by a bias circuit 308 that is controlled by a bias voltage $V_{in}$. The first digital-to-analog converter 304 converts a first digital data ($D_1$, $D_2$, $D_3$, $D_4$) to the charge reference current $I_{rc}$ which determines the value of the charge current $I_c$. Thus, the rising speed of the control signal $V_c$ may be determined. The second digital-to-analog converter 306 converts a second digital data ($D_1'$, $D_2'$, $D_3'$, $D_4'$) to the discharge reference current $I_{rd}$ which determines the value of the discharge current $I_d$. Thus, the decreasing speed of the control signal $V_c$ may be determined.

Figure 3B:
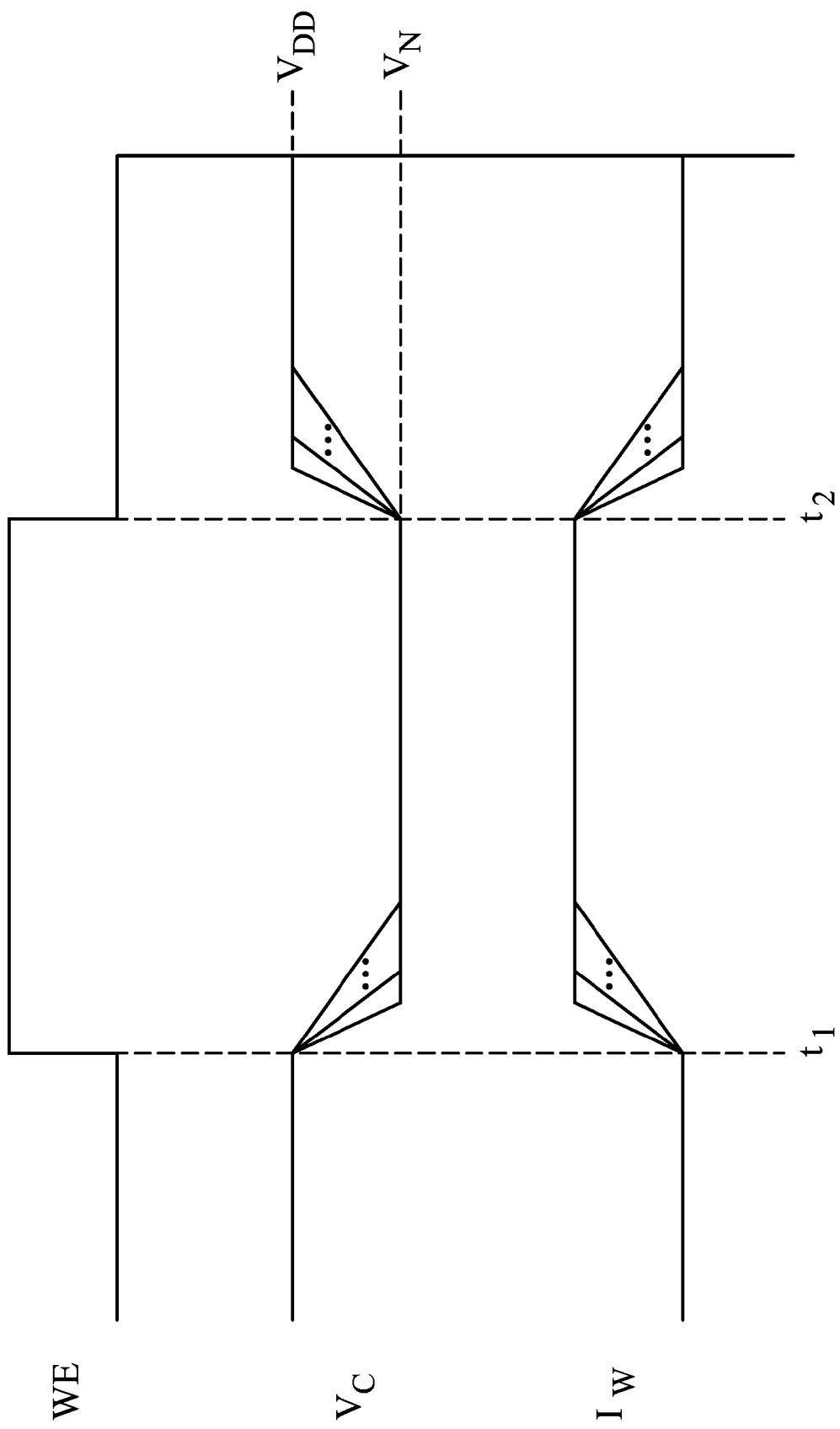
FIG. 3B shows waveforms of exemplary embodiments of the switching signal WE, the control signal $V_c$ and the operating current $I_w$ of FIG. 3A.

FIG. 3B shows waveforms of exemplary embodiments of the switching signal WE, the control signal $V_c$ and the operating current $I_w$ of FIG. 3A. At time index $t_1$, the control signal $V_c$ may be decreased at various speeds by different settings of the second digital data ($D_1'$, $D_2'$, $D_3'$, $D_4'$). Thus, the operating current $I_w$ may be raised by various speeds. At time index $t_2$, the control signal $V_c$ may be increased at various speeds by different settings of the first digital data ($D_1$, $D_2$, $D_3$, $D_4$). Thus, the operating current $I_w$ may be decreased by various speeds.

In other exemplary embodiments, the control circuit 112 may comprise the first digital-to-analog converter 304 but not the second digital-to-analog converter 306. In such a case, the operating current $I_w$ has a fixed rising speed but a controllable falling speed. In some exemplary embodiments, the control circuit 112 may comprise the second digital-to-analog converter 306 but not the first digital-to-analog converter 304. In such an embodiment, the operating current $I_w$ has a controllable rising speed but a fixed falling speed.

The controllable rising/falling speeds of the operating current $I_W$ may be used in accomplish multi-leveled storage capability, wherein multi-bits are stored by a single phase change storage element.

Figure 4:
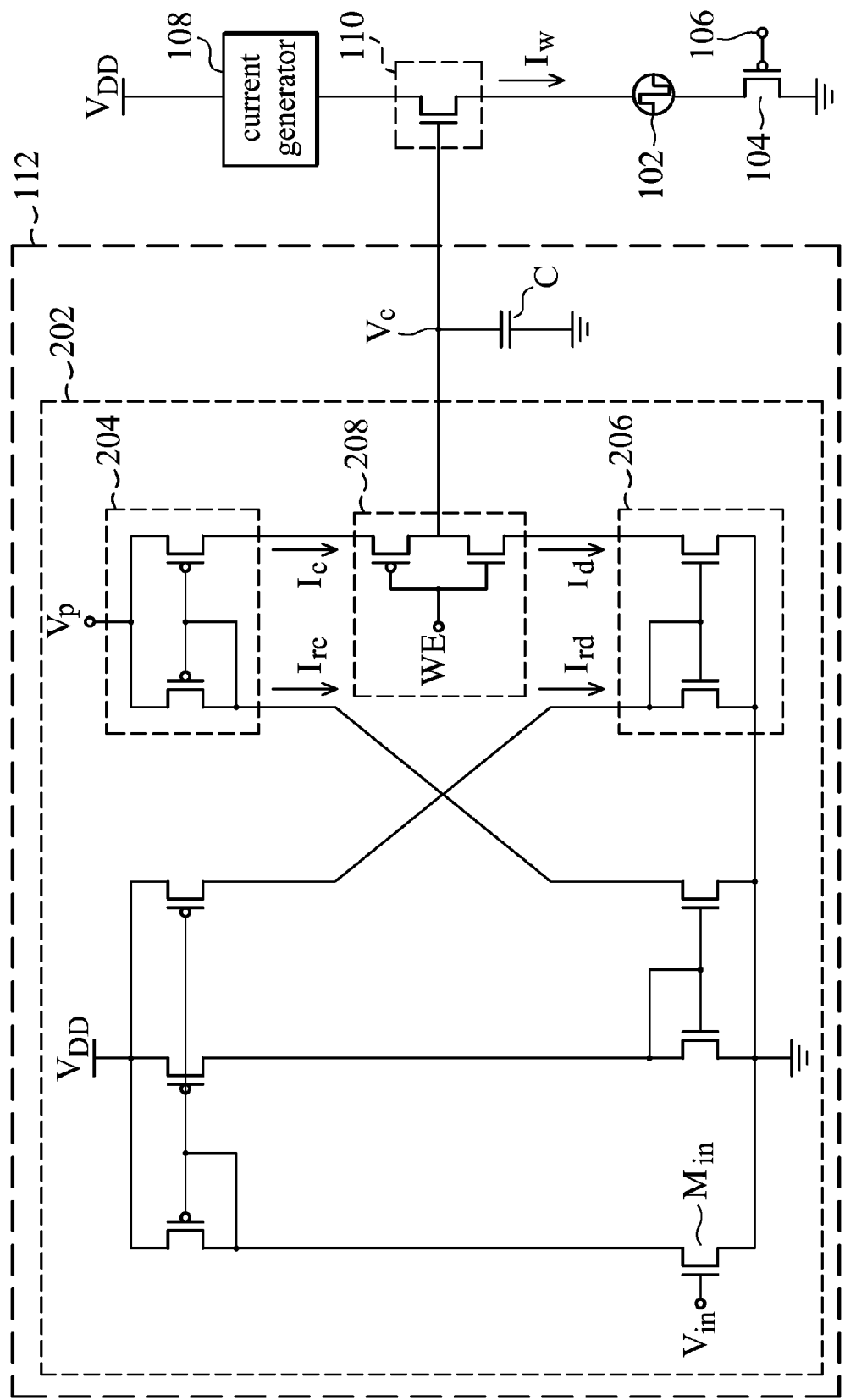
FIG. 4 depicts another exemplary embodiment of the phase change memory of the disclosure.

The transistor 110 is not limited to be a PMOS transistor, and may be replaced by an N-type metal-oxide-semiconductor (NMOS) transistor. FIG. 4 depicts another exemplary embodiment of the phase change memory of the disclosure, wherein the transistor 110 is realized by an NMOS transistor. As shown in FIG. 4, a first current minor 204 has a power terminal biased at a second pre-determined voltage $V_P$ (lower than source voltage $V_{DD}$) and the second current minor 206 has a grounded power terminal. Thus, the NMOS transistor (the transistor 110) is in a linear region.

Figure 5:
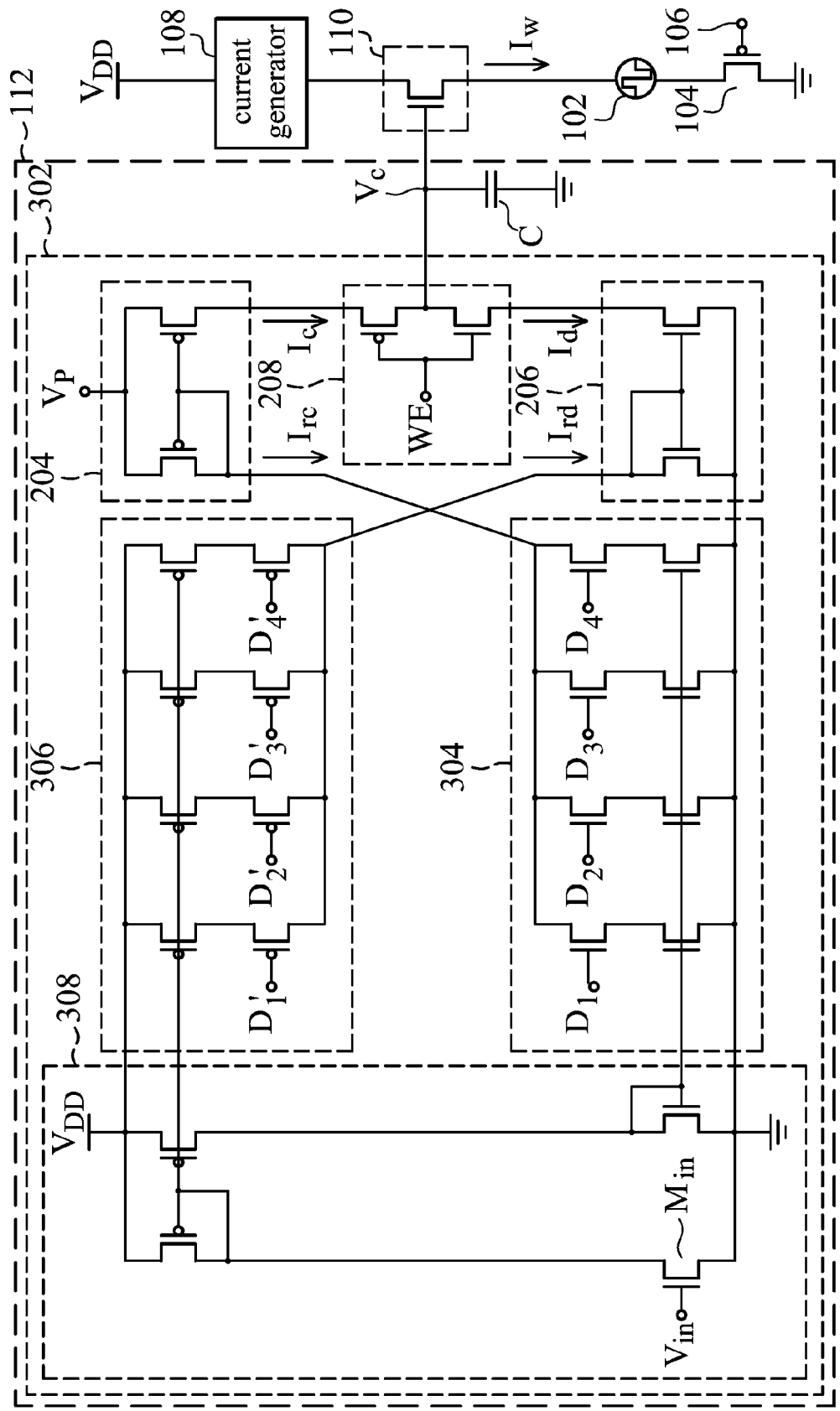
FIG. 5 depicts another exemplary embodiment of the phase change memory of the disclosure.

FIG. 5 depicts another exemplary embodiment of the phase change memory of the disclosure, wherein the transistor 110 is realized by an NMOS transistor. As shown in FIG. 5, a first current mirror 204 has a power terminal biased at a second pre-determined voltage value $V_P$ that is lower than the voltage VDD, and a second current minor 206 has a grounded power terminal. Thus, the NMOS transistor (the transistor 110) is in a linear region.

In some exemplary embodiments of the phase change memory of the disclosure, the capacitor C is optional. In embodiments in which the control circuit 112 does not include the capacitor C, the charge/discharge circuit (such as circuit 202 or 302) is designed to charge/discharge the parasitic capacitors at the control terminal of the transistor 110. The voltage level of the control terminal of the transistor 110 is carefully controlled, and the transistor 110 is limited in a linear region.

When the transistor 110 is realized by a PMOS transistor, the charge/discharge circuit (such as 202 or 302 of FIGS. 2A and 3A) is designed to charge/discharge the parasitic capacitors at the gate of the PMOS transistor.

When the transistor 110 is realized by an NMOS transistor, the charge/discharge circuit (such as 202 or 302 of FIGS. 4, 5) is designed to charge/discharge the parasitic capacitors at the gate of the NMOS transistor.

While the disclosure has been described by way of example and in terms of the exemplary embodiments, it is to be understood that the disclosure is not limited to the unveiled embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase change memory, comprising:
   a phase change storage element;
   a P-type metal-oxide-semiconductor (PMOS) transistor configured to adjust a current delivered to the phase change storage element in response to a control signal; and
   a control circuit configured to generate the control signal by charging or discharging a capacitor between a predetermined voltage and a source voltage, wherein the source voltage is provided to a source terminal of the PMOS transistor to thereby limit operation of the PMOS transistor to a linear region;
   wherein the predetermined voltage is higher than a ground voltage.

2. The phase change memory of claim 1,
   wherein the capacitor comprises a first terminal coupled to a control terminal of the PMOS transistor; and
   wherein the control circuit comprises a charge/discharge circuit, configured to charge or discharge the capacitor to vary the control signal between the predetermined voltage and the source voltage.

3. The phase change memory of claim 2, wherein the charge/discharge circuit comprises:
   a first current mirror configured to generate a charge current to charge the capacitor;
   a second current mirror configured to generate a discharge current to discharge the capacitor; and
   a charge/discharge switch configured to couple the capacitor to the first current mirror or the second mirror.

4. The phase change memory as claimed in of claim 3, wherein the charge/discharge circuit further comprises:
   a first digital-to-analog converter configured to generate a charge reference current in response to first digital data;
   wherein the first current mirror is configured to generate the charge current in response to the charge reference current.

5. The phase change memory of claim 4, wherein the charge/discharge circuit further comprises:
   a second digital-to-analog converter configured to generate a discharge reference current in response to second digital data;
   wherein the second current mirror is configured to generate the discharge current in response to the discharge reference current.

6. A phase change memory, comprising:
   a phase change storage element;
   an N-type metal-oxide-semiconductor (NMOS) transistor configured to adjust a current delivered to the phase change storage element in response to a control signal; and
   a control circuit configured to generate the control signal by charging or discharging a capacitor between a ground voltage and a predetermined voltage to thereby limit operation of the transistor to a linear region;
   wherein the predetermined voltage is lower than a source voltage coupled to a source terminal of the NMOS transistor.

7. The phase change memory of claim 6, wherein:
   the capacitor comprises a first terminal coupled to a control terminal of the NMOS transistor; and
   the control circuit comprises a charge/discharge circuit configured to charge or discharge the capacitor to vary the control signal between the ground voltage and the predetermined voltage.

8. The phase change memory of claim 7, wherein the charge/discharge circuit comprises:
   a first current mirror configured to generate a charge current to charge the capacitor;
   a second current mirror configured to generate a discharge current to discharge the capacitor; and
   a charge/discharge switch, configured to couple the capacitor to the first current mirror or the second current mirror.

9. The phase change memory of claim 8, wherein the charge/discharge circuit further comprises:
   a first digital-to-analog converter, configured to generate a charge reference current in response to first digital data;
   wherein the first current mirror is configured to generate the charge current in response to the charge reference current.

10. The phase change memory of claim 9, wherein the charge/discharge circuit further comprises:
    a second digital-to-analog converter configured to generate a discharge reference current in response to second digital data:
    wherein the second current mirror is configured to generate the discharge current in response to the discharge reference current.

* * * * *

UNITED STATES PATENT AND TRADEMARK OFFICE
CERTIFICATE OF CORRECTION

| | | |
|---|---|---|
| PATENT NO. | : 8,199,561 B2 | Page 1 of 1 |
| APPLICATION NO. | : 12/563971 | |
| DATED | : June 12, 2012 | |
| INVENTOR(S) | : Sheu et al. | |

It is certified that error appears in the above-identified patent and that said Letters Patent is hereby corrected as shown below:

In Column 3, Line 30, delete "minor 204" and insert -- mirror 204 --, therefor.

In Column 3, Line 34, delete "minor 206" and insert -- mirror 206 --, therefor.

In Column 3, Line 38, delete "$V_{in}$," and insert -- $V_{in}$ --, therefor.

In Column 3, Line 40, delete "current $I_{nt}$ In" and insert -- current $I_{rd}$. In --, therefor.

In Column 3, Line 42, delete "$M_{in}$," and insert -- $M_{in}$ --, therefor.

In Column 3, Line 43, delete "connected." and insert -- connected --, therefor.

In Column 3, Line 62, delete "minors 204" and insert -- mirrors 204 --, therefor.

In Column 4, Line 53, delete "minor 204" and insert -- mirror 204 --, therefor.

In Column 4, Line 55, delete "minor 206" and insert -- mirror 206 --, therefor.

In Column 4, Line 63, delete "VDD," and insert -- $V_{DD}$, --, therefor.

In Column 4, Line 63, delete "minor 206" and insert -- mirror 206 --, therefor.

In Column 5, Line 43, in Claim 2, delete "circuit," and insert -- circuit --, therefor.

In Column 5, Line 53, in Claim 3, delete "second mirror." and insert -- second current mirror. --, therefor.

In Column 5, Line 54, in Claim 4, delete "as claimed in of" and insert -- of --, therefor.

In Column 6, Line 38, in Claim 8, delete "switch," and insert -- switch --, therefor.

In Column 6, Line 42, in Claim 9, delete "converter," and insert -- converter --, therefor.

In Column 6, Line 51, in Claim 10, delete "data:" and insert -- data; --, therefor.

Signed and Sealed this
Twenty-third Day of October, 2012

David J. Kappos
*Director of the United States Patent and Trademark Office*